(12) United States Patent
Haase

(10) Patent No.: US 8,629,611 B2
(45) Date of Patent: Jan. 14, 2014

(54) WHITE LIGHT ELECTROLUMINESCENT DEVICES WITH ADJUSTABLE COLOR TEMPERATURE

(75) Inventor: Michael A. Haase, St. Paul, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 84 days.

(21) Appl. No.: 13/379,895

(22) PCT Filed: Jun. 25, 2010

(86) PCT No.: PCT/US2010/040017
§ 371 (c)(1),
(2), (4) Date: Dec. 21, 2011

(87) PCT Pub. No.: WO2011/002686
PCT Pub. Date: Jan. 6, 2011

(65) Prior Publication Data
US 2012/0104935 A1    May 3, 2012

Related U.S. Application Data

(60) Provisional application No. 61/221,660, filed on Jun. 30, 2009.

(51) Int. Cl.
*H01J 1/62* (2006.01)
(52) U.S. Cl.
USPC .............................. 313/499; 31/506
(58) Field of Classification Search
USPC ................... 313/498, 499, 506, 509, 512
See application file for complete search history.

(56) References Cited

U.S. PATENT DOCUMENTS

| 3,526,801 A | 9/1970 | Kruse |
| 5,048,035 A | 9/1991 | Sugawara |
| 5,600,158 A | 2/1997 | Noto |

(Continued)

FOREIGN PATENT DOCUMENTS

| DE | 103 54 936 | 4/2005 |
| EP | 1 010 773 | 6/2000 |

(Continued)

OTHER PUBLICATIONS

Cavus et al., "N-type doping of lattice-matched ZnCdSe and ZnxCdyMg1-x-ySe epilayers on InP using ZnCl2", Journal of Applied Physics, vol. 84, No. 3, pp. 1472-1475, Aug. 1, 1998, © 1998 American Institute of Physics.

(Continued)

*Primary Examiner* — Vip Patel
(74) *Attorney, Agent, or Firm* — Daniel J. Iden

(57) ABSTRACT

Solid state lighting devices include a first luminescent element (612) emitting light having a first spectrum, and a second luminescent element (614) emitting light having a second spectrum. The first luminescent element includes a first electroluminescent element (612a) that emits a first pump light, and a first light converting element (612b) that converts at least some of the first pump light to a first re-emitted light component. The second luminescent element includes a second electroluminescent element (614a) that emits a second pump light, and a second light converting element (614b) that converts at least some second pump light to a second re-emitted light component. The first and/or second light converting element includes a potential well. Light emitted by the first and second luminescent elements combine to provide a device output, which can approximate a Planckian locus over a range of color temperatures and exhibit a color rendering index of at least 60, 70, or 80.

20 Claims, 11 Drawing Sheets

(56) References Cited

U.S. PATENT DOCUMENTS

| | | |
|---|---|---|
| 5,861,717 A | 1/1999 | Begemann |
| 6,016,038 A | 1/2000 | Mueller |
| 6,636,003 B2 | 10/2003 | Rahm |
| 6,902,987 B1 | 6/2005 | Tong |
| 7,026,653 B2 | 4/2006 | Sun |
| 7,078,319 B2 | 7/2006 | Eliashevich |
| 7,126,160 B2 | 10/2006 | Sun |
| 7,141,445 B2 | 11/2006 | Sugawara |
| 7,202,613 B2 | 4/2007 | Morgan |
| 7,217,959 B2 | 5/2007 | Chen |
| 7,223,998 B2 | 5/2007 | Schwach |
| 7,279,716 B2 | 10/2007 | Chen |
| 7,288,902 B1 | 10/2007 | Melanson |
| 7,358,679 B2 | 4/2008 | Lys |
| 7,361,938 B2 | 4/2008 | Mueller |
| 7,387,405 B2 | 6/2008 | Ducharme |
| 7,402,831 B2 | 7/2008 | Miller |
| 7,417,260 B2 | 8/2008 | Wuu |
| 2002/0182319 A1 | 12/2002 | Ben-Malek |
| 2003/0010987 A1 | 1/2003 | Banin |
| 2005/0110034 A1 | 5/2005 | Fujiwara |
| 2005/0230693 A1 | 10/2005 | Chen |
| 2005/0274967 A1 | 12/2005 | Martin |
| 2005/0280013 A1 | 12/2005 | Sun |
| 2006/0001056 A1 | 1/2006 | Saxler |
| 2006/0124917 A1 | 6/2006 | Miller |
| 2006/0202215 A1 | 9/2006 | Wierer, Jr. |
| 2007/0221867 A1 | 9/2007 | Beeson |
| 2007/0284565 A1 | 12/2007 | Leatherdale |
| 2007/0290190 A1 | 12/2007 | Haase |
| 2008/0111123 A1 | 5/2008 | Tu |
| 2008/0230795 A1 | 9/2008 | Dias |
| 2008/0272712 A1 | 11/2008 | Jalink |
| 2008/0297027 A1 | 12/2008 | Miller |
| 2009/0014736 A1 | 1/2009 | Ibbetson |
| 2009/0108269 A1 | 4/2009 | Negley |
| 2010/0117997 A1 | 5/2010 | Haase |

FOREIGN PATENT DOCUMENTS

| | | |
|---|---|---|
| EP | 1 517 379 | 3/2005 |
| JP | 61-144078 | 7/1986 |
| JP | 2000-091707 | 3/2000 |
| KR | 10-0829925 | 8/2008 |
| WO | WO 00/76005 | 12/2000 |
| WO | WO 2006/062588 | 6/2006 |
| WO | WO 2007/034367 | 3/2007 |
| WO | WO 2007/073449 | 6/2007 |
| WO | WO 2007/114614 | 10/2007 |
| WO | WO 2008/109296 | 9/2008 |
| WO | WO 2009/036579 | 3/2009 |
| WO | WO 2009/048704 | 4/2009 |
| WO | WO 2009/148717 | 12/2009 |
| WO | WO 2009/158191 | 12/2009 |
| WO | WO 2010/019594 | 2/2010 |
| WO | WO 2010/027648 | 3/2010 |
| WO | WO 2010/028146 | 6/2010 |
| WO | WO 2009/158138 | 7/2010 |
| WO | WO 2010/074987 | 7/2010 |
| WO | WO 2010/033379 | 11/2010 |
| WO | WO 2010/129409 | 11/2010 |
| WO | WO 2010/129412 | 11/2010 |
| WO | WO 2011/008474 | 1/2011 |
| WO | WO 2011/008476 | 1/2011 |

OTHER PUBLICATIONS

Chang et al., "MBE Growth and Characterization of (ZnMG) (SeTe)", Journal of the Korean Physical Society, vol. 34, pp. S4-S6, Apr. 1999.

CIE, International Commission on Illumination, Technical Report, ISBN 978 3 900734 57 2, 13.3, 1995.

Guo et al., "Photon Recycling Semiconductor Light Emitting Diode", IEEE Xplore, 4 pages, Downloaded on Oct. 29, 2008, © 1999 IEEE.

Horng et al., "Phosphor-Free White Light From InGaN Blue and Green Light-Emitting Diode Chips Covered With Semiconductor-Conversion AlGaInP Epilayer", IEEE Photonics Technology Letters, vol. 20, No. 13, pp. 1139-1141, Jul. 1, 2008.

Horng et al., "Red-enhanced white light-emitting diodes using external AlGaInP epilayers with various aperture ratios", Journal of Luminescence, vol. 128, pp. 647-651, 2008, © 2007 Elsevier B.V.

Jones, E. D., "Diffusion of Indium Into Cadmium Sulphide", Journal of Physical Chemistry Solids, vol. 39, pp. 11-18, Pergamon Press, Great Britain, 1978.

Kobayashi, Naoki, "Single quantum well photoluminescence in ZnSe/GaAs/AlGaAs grown by migration-enhanced epitaxy", Applied Physics Letters, vol. 55, No. 12, pp. 1235-1237, Sep. 18, 1989, © 1989 American Institute of Physics.

Krystek, M., "An Algorithm to Calculate Correlated Colour Temperature", Color Research and Application, vol. 10, pp. 38-40, © 1985 by John Wiley & Sons, Inc.

Litz et al., "Epitaxy of $Zn_{1-x}Mg_xSe_yTe_{1-y}$ on (100) InAs", Journals of Crystal Growth, vol. 159, pp. 54-57, 1999.

Odnoblyudov, V.A. and Tu, C. W., "Gas-source molecular-beam eptitaxial growth of Ga(In)NP on GaP(100) substrates for yellow-amber light-emitting devices", Journal of Vacuum Science and Technology B, vol. 23, No. 3, pp. 1317-1319, May/Jun. 2005, © 2005 American Vacuum Society.

Official Journal of the European Union, "Directive 2002/95/EC of the European Parliament and of the Council, of Jan. 27, 2003, on the restriction of the use of certain hazardous substances in electrical equipment", pp. L 37/19 to L 37/23, Feb. 2, 2003.

Official Journal of the European Union, "Commission Decision, of Aug. 18, 2005, amending Directive 2002/95/EC of the European Parliament and of the Council for the purpose of establishing the maximum concentration values for certain hazardous substances in electrical and electronic equipment", 2005/618/EC, p. L 214/65, Aug. 19, 2005.

Schubert, Fred E., Light Emitting Diodes, pp. 133-144, Second Edition, Universtity Press, Cambridge, U.K., © E. Fred Schubert, 2006.

Schubert, Fred E., Light Emitting Diodes, pp. 209-211, Second Edition, Universtity Press, Cambridge, U.K., © E. Fred Schubert, 2006.

Search Report for International Application No. PCT/US2010/040017, 5 pages, Date of Mailing Sep. 9, 2010.

Sethi, B.R. and Mather P. C., "Effect of Heavy Doping of ZnSe Crystals with Indium in Creating Compensating Acceptors", Physica Status Solidi. (a), pp. 717-721, 1978.

Takashima et al., "Proposal of a novel BeZnSeTe quaternary for II-VI middle range visible light emitting devices on InP substrates", Physica Status Solidi (b), vol. 241, No. 3, pp. 747-750, © 2004 Wiley-VCH.

Written Opinion for International Application No. PCT/US2010/040017, 8 pages, Date of Mailing Sep. 9, 2010.

Zeng et al., "Red-green-blue photopumped lasing from ZnCdMgSe/ZnCdSe quantum well laser structures grown on Inp", Applied Physics Letters, vol. 72, No. 24, pp. 3136-3138, Jun. 15, 1998, © 1998 American Institute of Physics.

WHITE LIGHT ELECTROLUMINESCENT DEVICES WITH ADJUSTABLE COLOR TEMPERATURE

CROSS REFERENCE TO RELATED APPLICATIONS

This application is a national stage filing under 35 U.S.C. 371 of PCT/US2010/040017, filed on Jun. 25, 2010, which claims priority to U.S. Provisional Application No. 61/221,660, filed on Jun. 30, 2009, the disclosure of which is incorporated by reference in its/their entirety herein.

CROSS-REFERENCE TO RELATED APPLICATIONS

Reference is made to the following pending and/or commonly filed U.S. patent applications, the features of which can be incorporated into the embodiments presently disclosed: U.S. Application Ser. No. 61/175,640, "Re-Emitting Semiconductor Construction With Enhanced Extraction Efficiency", filed May 5, 2009; U.S. Application Ser. No. 61/175,632, "Semiconductor Devices Grown on Indium-Containing Substrates Utilizing Indium Depletion Mechanisms", filed May 5, 2009; U.S. Application Ser. No. 61/175,636, "Re-Emitting Semiconductor Carrier Devices For Use With LEDs and Methods of Manufacture", filed May 5, 2009; and U.S. Application Ser. No. 61/221,664, "Electroluminescent Devices With Color Adjustment Based on Current Crowding", filed on even date herewith.

FIELD OF THE INVENTION

This invention relates generally to solid state semiconductor light sources and related devices, systems, and methods.

BACKGROUND

A wide variety of semiconductor devices, and methods of making semiconductor devices, are known. Some of these devices are designed to emit light, such as visible or near-visible (e.g. ultraviolet or near infrared) light. Examples include electroluminescent devices such as light emitting diodes (LEDs) and laser diodes, wherein an electrical drive current or similar electrical signal is applied to the device so that it emits light. Another example of a semiconductor device designed to emit light is a re-emitting semiconductor construction (RSC).

Unlike an LED, an RSC does not require an electrical drive current from an external electronic circuit in order to emit light. Instead, the RSC generates electron-hole pairs by absorption of light at a first wavelength $\lambda_1$ in an active region of the RSC. These electrons and holes then recombine in potential wells in the active region to emit light at a second wavelength $\lambda_2$ different from the first wavelength $\lambda_1$, and optionally at still other wavelengths $\lambda_3$, $\lambda_4$, and so forth depending on the number of potential wells and their design features. The initiating radiation or "pump light" at the first wavelength $\lambda_1$ is typically provided by a blue, violet, or ultra-violet emitting LED coupled to the RSC. Exemplary RSC devices, methods of their construction, and related devices and methods can be found in, e.g., U.S. Pat. No. 7,402,831 (Miller et al.), U.S. Patent Application Publications US 2007/0284565 (Leatherdale et al.) and US 2007/0290190 (Haase et al.), PCT Publication WO 2009/048704 (Kelley et al.), and pending U.S. Application Ser. No. 61/075,918, "Semiconductor Light Converting Construction", filed Jun. 26, 2008, all of which are incorporated herein by reference.

When reference is made herein to a light at a particular wavelength, the reader will understand that reference is being made to light having a spectrum whose peak wavelength is at the particular wavelength.

FIG. 1 shows an illustrative device 100 that combines an RSC 108 and an LED 102. The LED has a stack of LED semiconductor layers 104, sometimes referred to as epilayers, on an LED substrate 106. The layers 104 may include p- and n-type junction layers, light emitting layers (typically containing quantum wells), buffer layers, and superstrate layers. The layers 104 may be attached to the LED substrate 106 via an optional bonding layer 116. The LED has an upper surface 112 and a lower surface, and the upper surface is textured to increase extraction of light from the LED compared to the case where the upper surface is flat. Electrodes 118, 120 may be provided on these upper and lower surfaces, as shown. When connected to a suitable power source through these electrodes, the LED emits light at a first wavelength $\lambda_1$, which may correspond to blue or ultraviolet (UV) light. Some of this LED light enters the RSC 108 and is absorbed there.

The RSC 108 is attached to the upper surface 112 of the LED via a bonding layer 110. The RSC has upper and lower surfaces 122, 124, with pump light from the LED entering through the lower surface 124. The RSC also includes a quantum well structure 114 engineered so that the band gap in portions of the structure is selected so that at least some of the pump light emitted by the LED 102 is absorbed. The charge carriers generated by absorption of the pump light move into other portions of the structure having a smaller band gap, the quantum well layers, where the carriers recombine and generate light at the longer wavelength. This is depicted in FIG. 1 by the re-emitted light at the second wavelength $\lambda_2$ originating from within the RSC 108 and exiting the RSC to provide output light.

FIG. 2 shows an illustrative semiconductor layer stack 210 comprising an RSC. The stack was grown using molecular beam epitaxy (MBE) on an indium phosphide (InP) wafer. A GaInAs buffer layer was first grown by MBE on the InP substrate to prepare the surface for II-VI growth. The wafer was then moved through an ultra-high vacuum transfer system to another MBE chamber for growth of II-VI epitaxial layers used in the RSC. Details of the as-grown RSC are shown in FIG. 2 and summarized in Table 1. The table lists the thickness, material composition, band gap, and layer description for the different layers associated with the RSC. The RSC included eight CdZnSe quantum wells 230, each having a transition energy of 2.15 eV. Each quantum well 230 was sandwiched between CdMgZnSe absorber layers 232 having a band gap energy of 2.48 eV that could absorb blue light emitted by an LED. The RSC also included various window, buffer, and grading layers.

TABLE 1

| Reference No. | Material | Thickness (nm) | Band Gap/ Transition (eV) | Comment |
|---|---|---|---|---|
| 230 | $Cd_{0.48}Zn_{0.52}Se$ | 3.1 | 2.15 | quantum well |
| 232 | $Cd_{0.38}Mg_{0.21}Zn_{0.41}Se$ | 8 | 2.48 | absorber |
| 234 | $Cd_{0.38}Mg_{0.21}Zn_{0.41}Se:Cl$ | 92 | 2.48 | absorber |
| 236 | $Cd_{0.22}Mg_{0.45}Zn_{0.33}Se$ | 100 | 2.93 | window |
| 238 | $Cd_{0.22}Mg_{0.45}Zn_{0.33}Se \rightarrow Cd_{0.38}Mg_{0.21}Zn_{0.41}Se$ | 250 | 2.93-2.48 | grading |
| 240 | $Cd_{0.38}Mg_{0.21}Zn_{0.41}Se:Cl$ | 46 | 2.48 | absorber |

TABLE 1-continued

| Reference No. | Material | Thickness (nm) | Band Gap/ Transition (eV) | Comment |
|---|---|---|---|---|
| 242 | $Cd_{0.38}Mg_{0.21}Zn_{0.41}Se \rightarrow Cd_{0.22}Mg_{0.45}Zn_{0.33}Se$ | 250 | 2.48-2.93 | grading |
| 244 | $Cd_{0.39}Zn_{0.61}Se$ | 4.4 | 2.24 | II-VI buffer |
| 246 | $Ga_{0.47}In_{0.53}As$ | 190 | 0.77 | III-V buffer |
| 224 | InP | 350,000 | 1.35 | III-V substrate |

Further details of this and other RSC devices can be found in PCT Publication WO 2009/048704 (Kelley et al.).

Of particular interest to the present application are light sources that are capable of emitting white light. In some cases, known white light sources are constructed by combining an electroluminescent device such as a blue-emitting LED with first and second RSC-based luminescent elements. The first luminescent element may, for example, include a green-emitting potential well that converts some of the blue light to green light, and transmits the remainder of the blue light. The second luminescent element may include a potential well that converts some of the green and/or blue light it receives from the first luminescent element into red light, and transmits the remainder of the blue and green light. The resulting red, green, and blue light components combine to allow such a device, which is described (among other embodiments) in WO 2008/109296 (Haase), to provide substantially white light output.

Some devices provide white light using a pixelated arrangement or array. That is, multiple individual light-emitting elements, none of which emit white light by themselves, are arranged in close proximity to each other so as to collectively form a pixel. The pixel typically has a characteristic dimension or size below the resolution limit of the observation system, so that light from the different light-emitting elements is effectively combined in the observation system. A common arrangement for such a device is for three individual light-emitting elements—one emitting red (R) light, one emitting green (G) light, one emitting blue (B) light—to form an "RGB" pixel. Reference is again made to WO 2008/109296 (Haase), for disclosure of some such devices.

Also of interest to the present application are light sources that are not only capable of emitting white light, but also of changing or adjusting the apparent color of the output. For example, in some cases a "cool" white color may be desired, while in others a "warm" white color may be desired. A given "shade" of white may be plotted as an (x,y) color coordinate on a conventional CIE chromaticity diagram, and can be characterized by a color temperature as is known by those skilled in the art.

U.S. Pat. No. 7,387,405 (Ducharme et al.), for example, discusses lighting systems that provide adjustable color temperature. One such lighting system uses multiple light sources constructed by combining a blue-emitting LED with a layer of yellow phosphor. Some of the blue light is absorbed by the phosphor and re-emitted as yellow light, and some of the blue light passes through the phosphor layer. The transmitted blue light combines with the re-emitted yellow light to produce an output beam having an overall output spectrum that is perceived as nominally white light. Device-to-device variations in phosphor layer characteristics and/or other design details give rise to device-to-device differences in the output spectrum and corresponding differences in perceived color, with some LED/phosphor devices providing a "cool" white color and others providing a "warm" white color. The '405 patent reports that some commercial LED/phosphor devices exhibit color temperatures of 20,000 degrees Kelvin (20,000K) while others exhibit color temperatures of 5750K. The '405 patent also reports that a single one of these LED/phosphor devices allows for no control of color temperature, and that a system with a desired range of color temperature cannot be generated with one device alone. The '405 patent goes on to describe an embodiment in which two such LED/phosphor devices are combined with an optical long-pass filter (a transparent piece of glass or plastic tinted so as to enable only longer wavelength light to pass through) that shifts the color temperature of the devices, and then a specific third LED (an Agilent HLMP-EL 18 amber LED) is added to these filtered LED/phosphor devices to provide a 3-LED embodiment with adjustable color temperature.

BRIEF SUMMARY

The present application discloses, inter alia, solid state lighting devices that include a first and second luminescent element. The first luminescent element is configured to emit light having a first spectral distribution, and the second luminescent element is configured to emit light having a second spectral distribution. The first luminescent element includes a first electroluminescent element that emits a first pump light, and a first light converting element that converts at least some of the first pump light to a first re-emitted light component. The second luminescent element includes a second electroluminescent element that emits a second pump light, and a second light converting element that converts at least some of the second pump light to a second re-emitted light component. At least one of the first and second light converting elements includes a first semiconductor stack that includes a first potential well. The first and second luminescent elements are disposed so that the light emitted by the first and second luminescent elements combine to provide a device output.

Preferably, the first and second spectral distributions can be represented by first and second endpoints, respectively, that define a line segment on a standard CIE (x,y) color coordinate diagram. The line segment may represent a range of possible device outputs for different relative amounts of the light emitted by the first luminescent element and the light emitted by the second luminescent element. In exemplary embodiments, the line segment also approximates a "Planckian locus" at least over a given range. The person skilled in the art will understand that the Planckian locus refers to the color of an ideal blackbody source over a range of temperatures ordinarily measured in degrees Kelvin, which temperature is referred to as "color temperature" $T_c$. Thus, the line segment may approximate the Planckian locus over a range of color temperatures from 3000K to 5000K, or from 2500K to 5000K, for example. Over such color temperature ranges, the line segment may deviate from the Planckian locus by a distance of less than 0.04, or less than 0.02, on the CIE (x,y) plane.

Furthermore, in exemplary embodiments, the first and second luminescent elements produce a device output that exhibits good "color rendering" characteristics. The person skilled in the art will be familiar with the color rendering index, which is discussed further below. The device output may desirably exhibit a color rendering index of at least 60, or at least 70, or at least 80. Further, such color rendering index values may be maintained over a range of color temperatures of the device output, e.g., over a range of color temperatures from 3000K to 5000K, or from 2500K to 5000K, for example.

In some embodiments, the first and second pump lights each exhibit a peak wavelength in a range from 350 to 500 nm.

For example, they may each comprise UV, violet, and/or blue light. In some embodiments, the peak wavelength of the first pump light may be substantially the same as the peak wavelength of the second pump light. The first and second electroluminescent sources may comprise different portions of a unitary semiconductor element, e.g., different regions of an LED or similar semiconductor device that are separately electrically addressable. Alternately, the first and second electroluminescent sources may comprise distinct semiconductor elements.

In some cases, the first light converting element may include a phosphor, and the second light converting element may include the first semiconductor stack that includes the first potential well. In other cases, the first light converting element may include the first semiconductor stack, and the second light converting element may include a second semiconductor stack that includes a second potential well. In some cases, the first spectral distribution may be characterized by a cyan color, and the second spectral distribution may be characterized by an amber color. In some cases, the first spectral distribution may include or consist essentially of a first emission band having a peak emission between 400 nm and 500 nm, and a second emission band having a peak emission between 500 nm and 600 nm. The second spectral distribution may include or consist essentially of a third emission band having a peak emission between 500 nm and 600 nm, and a fourth emission band having a peak emission between 600 nm and 700 nm, for example. The first and second spectral distributions, whether individually or combined, may exhibit peak wavelengths that differ from each other by at least 10 nm.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF DRAWINGS

In the figures, like reference numerals designate like elements.

DETAILED DESCRIPTION OF ILLUSTRATIVE EMBODIMENTS

As summarized above, the present application describes (among other things) lighting devices in which light emitted from a first luminescent element can be combined with light emitted from a second luminescent element to provide a device optical output. The relative amounts of light from these first and second luminescent elements can be adjusted so as to adjust a color, e.g. a color temperature, of the device optical output. If the spectral distributions (spectra) of the light emitted by the first and second luminescent elements are judiciously chosen, then the perceived color of the device optical output can be made to approximate the color of an ideal blackbody source at a given temperature $T_c$. Furthermore, adjustments to the color of the device optical output (made via adjustments in the relative amount of light from the first and second luminescent elements) can be made so that the resulting adjusted color(s) also approximate the color of a blackbody source, but at different color temperature(s) $T_c$.

We have found that spectra for the first and second luminescent elements can be readily obtained that not only satisfy these desirable color temperature properties, but that can also provide good color rendering capabilities. For example, modeling has shown that color rendering indices of at least 60, or at least 70, or at least 80 can be obtained. Moreover, these color rendering indices can be maintained over wide ranges of color adjustment of the device optical output, e.g., over a color temperature range from 3000K to 5000K, or from 2500K to 5000K, for example.

Such devices can be fabricated using a combination of suitable electroluminescent sources such as LEDs or the like that emit pump light, and light converting elements such as RSCs, phosphors, or the like, that convert at least some of the pump light to re-emitted light. The devices themselves and various key components are described further below. Before proceeding with such description, however, we will first describe the unique optical properties, including color appearance characteristics (including adjustment thereof) and color rendering characteristics, of the devices. To do this, we use a CIE chromaticity diagram.

Those skilled in the art will be familiar with a tool or standard used to characterize and quantify perceived colors, in particular, the well-known 1931 CIE chromaticity diagram, promulgated by the Commission International de l'Eclairage (International Commission on Lighting) or "CIE". The color (or "chromaticity" or "chromaticity coordinates") of a light source or article can be precisely measured or specified by a point or region expressed in terms of one or more chromaticity coordinates (x,y) on the CIE chromaticity diagram, using the CIE 1931 standard colorimetric system.

Figure 3:
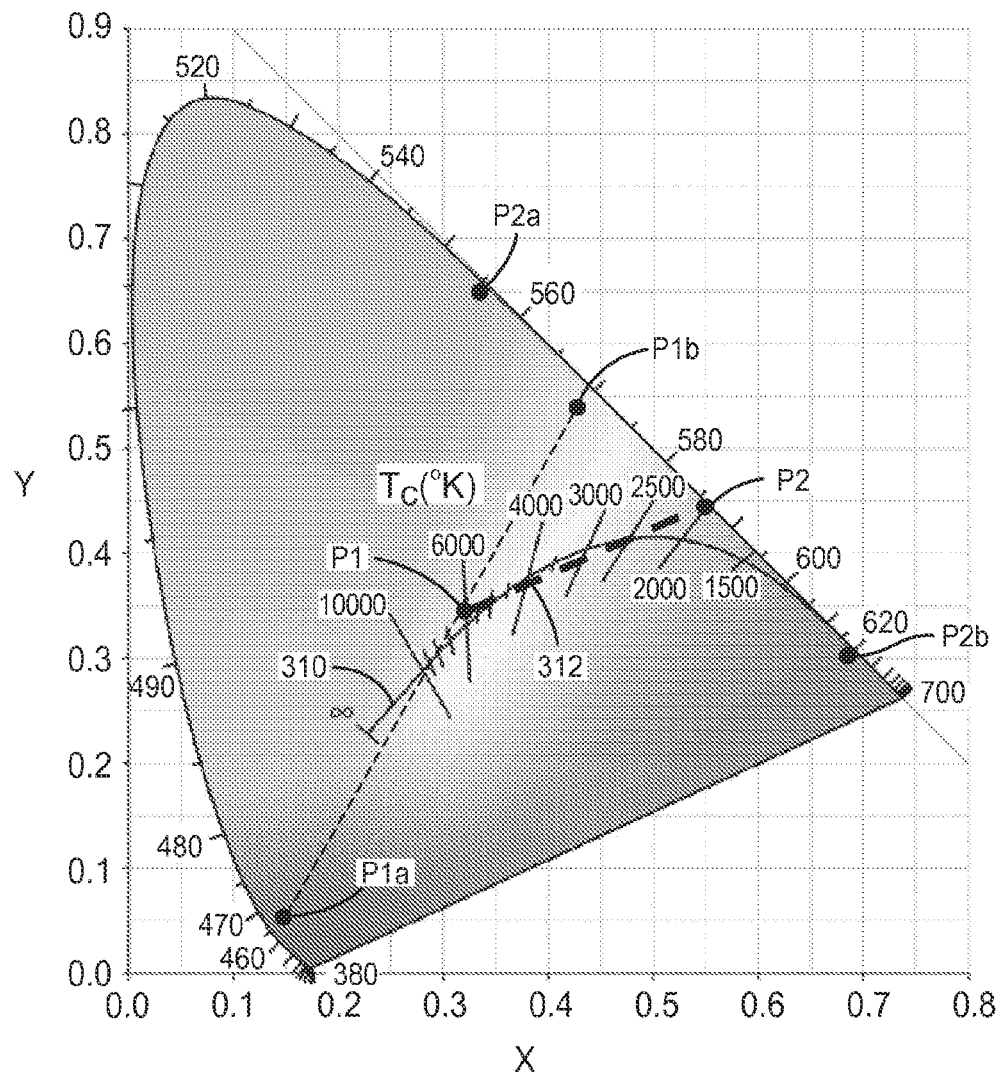
FIG. 3 is a CIE chromaticity diagram on which is plotted a line segment representative of a lighting device.

Such a chromaticity diagram is shown in FIG. 3. Those skilled in the art will recognize curve 310 as the Planckian locus described above. Other features on the diagram are representative of a particular embodiment or embodiments of a lighting device.

In particular, points P1 and P2 are representative of the colors of the light emitted by a first and second luminescent element, respectively. These colors have been specially chosen so that the line segment 312 that connects points P1 and P2 closely approximates the Planckian locus 310 over a substantial portion thereof. In the depicted embodiment, line segment 312 deviates from Planckian locus 310 by no more than a distance of 0.005 on the CIE (x,y) plane over a range of color temperatures (for the Planckian locus) from 3000K to 5000K. Over a wider color temperature range from 2500K to 5000K, the line segment 312 deviates from Planckian locus 310 by no more than a distance of 0.01 in the CIE (x,y) plane.

The reader will keep in mind that the line segment 312 represents the set of all possible optical outputs for lighting devices whose outputs are composed of a linear combination of the light emitted by the first luminescent element (represented by P1) and the light emitted by the second luminescent element (represented by P2). Thus, for example, a lighting device whose optical output is composed of equal parts of the light represented by P1 and the light represented by P2 is represented by a point that bisects line segment 312. If the proportion of the light of point P1 is increased, the device output point moves along line segment 312 towards point P1. If instead the proportion of the light of point P2 is increased, the device output point moves along line segment 312 towards point P2. Thus, by adjusting the relative amounts of light emitted by the first and second luminescent elements, the color of the device output can be changed or adjusted.

The colors represented by points P1, P2 may be achieved with many different combinations of electroluminescent sources and light converting elements, since any particular color coordinate on the CIE chromaticity diagram may be associated with numerous optical spectra that may differ substantially from each other. All such combinations are encompassed by the present disclosure. We have found it advantageous, however, to produce one or both of points P1, P2 using a combination of a small number of distinct spectral peaks, e.g., exactly two distinct spectral peaks for one or each point, or exactly three distinct spectral peaks for one or each point, for example.

Figure 3A:
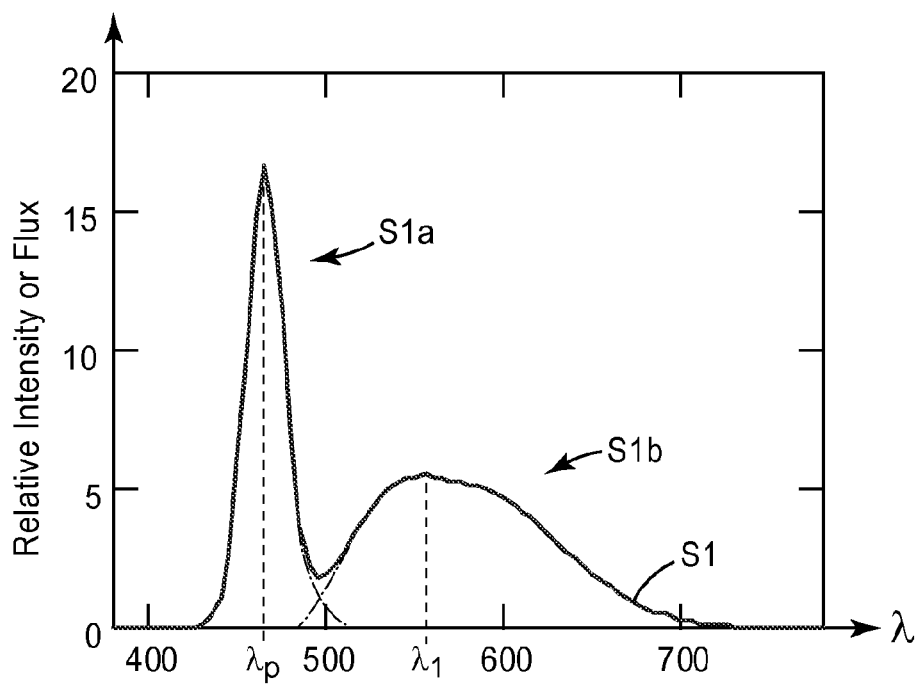
FIGS. 3a and 3b are graphs of the emission spectra of two components of the lighting device of FIG. 3.

In the embodiment depicted, the light represented by point P1 is a combination of two distinct spectral peaks, one of which is represented by point P1a and the other of which is represented by point P1b. The light represented by point P1a is typical of light emitted by a blue LED, having a peak wavelength of about 465 nm and a spectral width, measured for example as the full-width at half-maximum (FWHM) value, of less than 50 nm, or less than 30 nm, for example 25 nm. The light represented by point P1b is representative of light that is re-emitted from a yellow phosphor such as cerium-doped yttrium aluminum garnet (YAG:Ce) when the phosphor is excited with blue or other short wavelength light. Such re-emitted light may have a peak wavelength of about 550 nm and a FWHM spectral width less than 150 nm, or less than 100 nm. FIG. 3a shows a spectrum S1 that is illustrative of points P1, P1a, and P1b. In particular, the spectrum S1 is a mixture or combination of a first spectral peak S1a and a (partially overlapping) second spectral peak S1b. The first spectral peak S1a has a peak wavelength $\lambda_p$ and a spectral width that is typical of blue pump light emitted by a blue LED, the color of which is represented by point P1a. The second spectral peak S1b has a peak wavelength $\lambda_1$ and a spectral width that is typical of re-emitted light from a yellow phosphor, the color of which is represented by point P1b. The combination of the two spectral peaks S1a, S1b, in suitable relative amounts or proportions, produces the resulting spectrum S1, the color of which is represented by point P1. In the depicted embodiment, the proportion is selected such that the integrated intensity of spectral peak S1b is about 2.3 times the integrated intensity of spectral peak S1a, resulting in a color for point P1 that is nominally white. Light having the spectrum S1 can be produced by a first luminescent element that includes a blue light-emitting electroluminescent source over which is applied a layer of yellow phosphor material, where the phosphor layer is suitably thin or otherwise designed to transmit an appropriate portion of the blue pump light.

Similarly, in the depicted embodiment, the light represented by point P2 is also a combination of two distinct spectral peaks, one of which is represented by point P2a and the other of which is represented by point P2b. The light represented by point P2a is typical of light re-emitted by one or more potential wells of a re-emitting semiconductor construction (RSC) such as is described in connection with FIGS. 1 and 2, when the RSC is excited with blue or other short wavelength pump light. Such potential well(s) in this embodiment are designed to re-emit green light, having a peak wavelength of about 555 nm and a FWHM spectral width of less than 50 nm, or less than 30 nm, for example 18 nm. The light represented by point P2b is also representative of light that is re-emitted from one or more potential wells of an RSC when illuminated with short wavelength pump light, but the potential well(s) associated with point P2b are different from the potential well(s) associated with point P2a. The potential well(s) associated with point P2b are designed to re-emit red light, having a peak wavelength of about 620 nm and a FWHM spectral width of less than 50 nm, or less than 30 nm, for example 18 nm. The combination of the two spectral peaks S2a, S2b, in suitable relative amounts or proportions, produces the resulting spectrum S2, the color of which is represented by point P2. In the depicted embodiment, the proportion is selected such that the integrated intensity of spectral peak S2b is about 2 times the integrated intensity of spectral peak S2a, resulting in a color for point P2 that is substantially amber. Light having the spectrum S2 can be produced by a first luminescent element that includes a blue or other short wavelength pump light-emitting electroluminescent source over which is applied a suitably designed RSC, where the RSC is designed to substantially block the pump light (note the absence of any significant intensity at the pump wavelength $\lambda_p$ in the spectrum S2) and to emit light having the spectral peak S2a and light having the spectral peak S2b in the correct proportion. In order to substantially block the pump light, the RSC may include a light filtering layer that absorbs substantially all of the short wavelength light supplied by the pump light source at the wavelength $\lambda_p$ that is not absorbed by any absorbing layer(s) of the RSC, but which highly transmits the re-emitted light originating from the potential well(s), which layer is sometimes referred to as a "cyan blocker". In this regard, the reader is referred to co-pending U.S. patent application Ser. No. 61/175,636, "Re-Emitting Semiconductor Carrier Devices For Use With LEDs and Methods of Manufacture", filed May 5, 2009, incorporated herein by reference. In a finished device, such a layer may be included on a side of the RSC opposite the side facing the pump light source, i.e., such that the active region and particularly the potential wells of the active region are disposed between the pump light source and the light filtering layer/cyan blocker.

Figure 1:
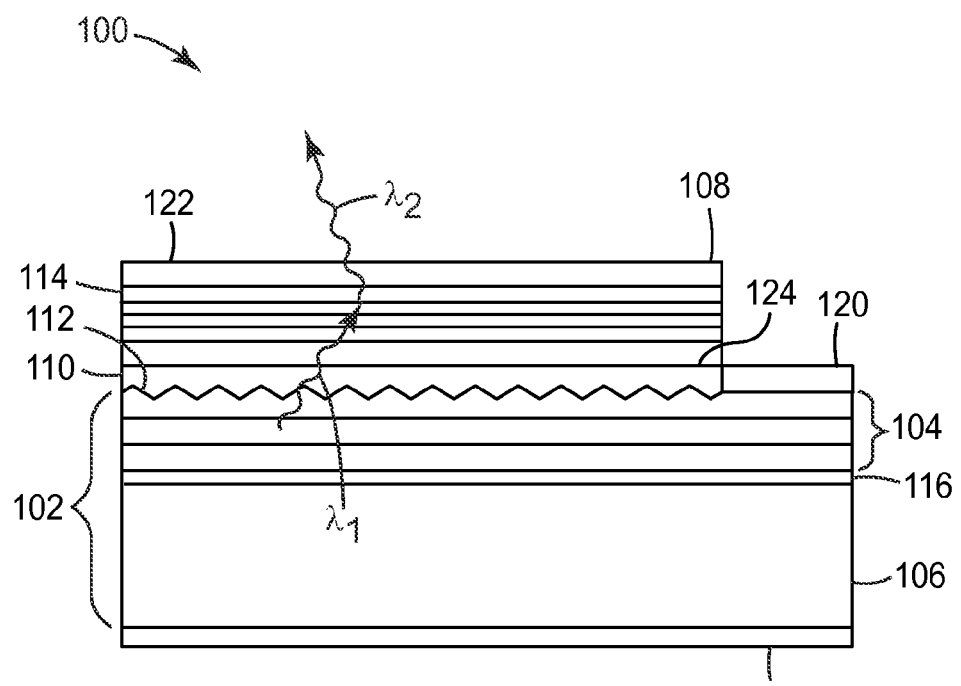
FIG. 1 is a schematic side view of a combination LED/RSC device.
Figure 2:
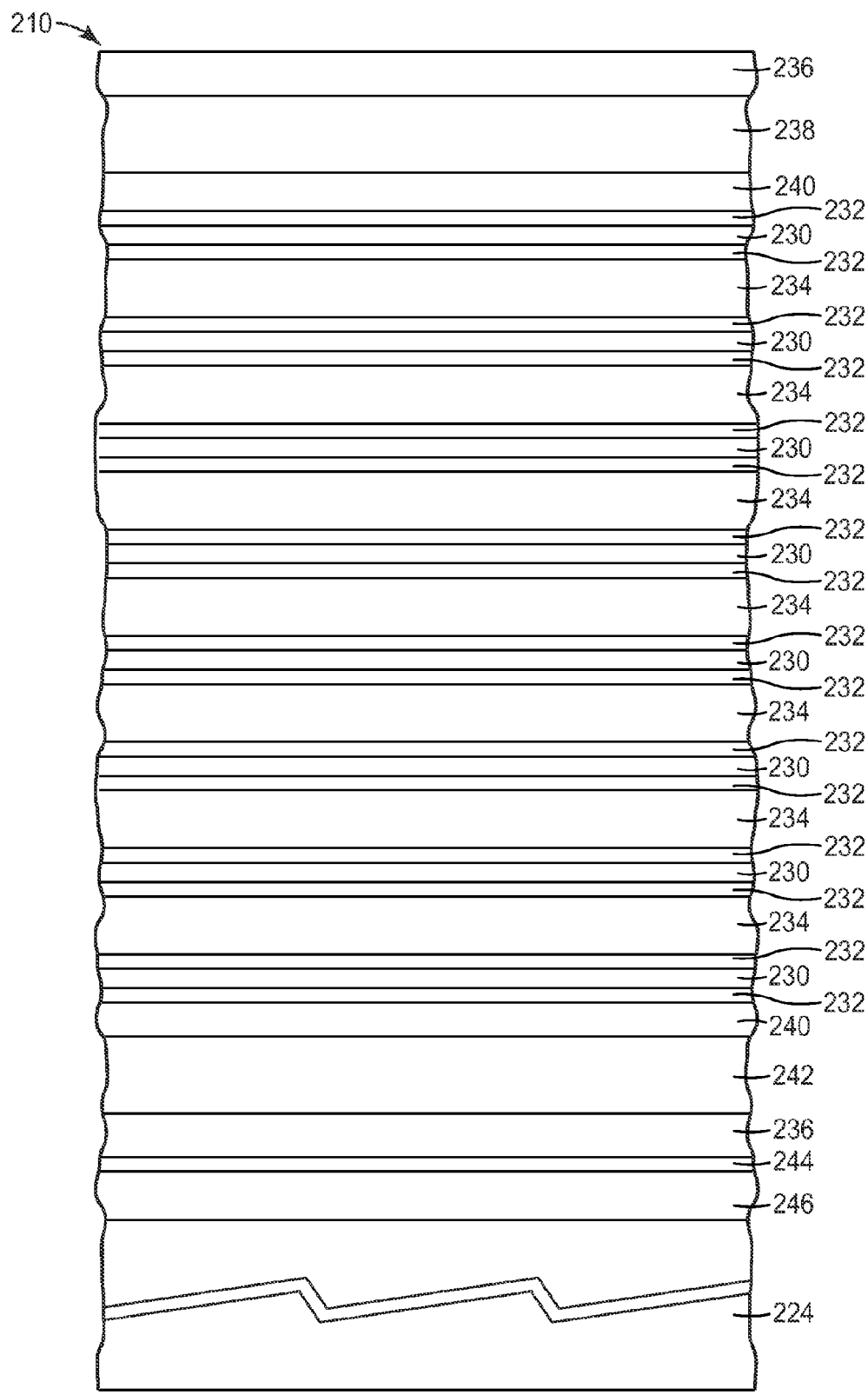
FIG. 2 is a schematic side view of an exemplary semiconductor layer stack that includes an RSC.

Note that in the foregoing description of FIG. 3a, the symbol $\lambda_1$ has a somewhat different meaning from its meaning in FIG. 1, since in FIG. 3a it is associated with re-emitted light from a light-converting element, but in FIG. 1 it is associated with pump light generated by an electroluminescent device. The symbol $\lambda_2$, which is associated with re-emitted light from a light-converting element in both FIGS. 3b and 1, can have the same meaning or can have a somewhat different meaning in these two figures.

Figure 3B:
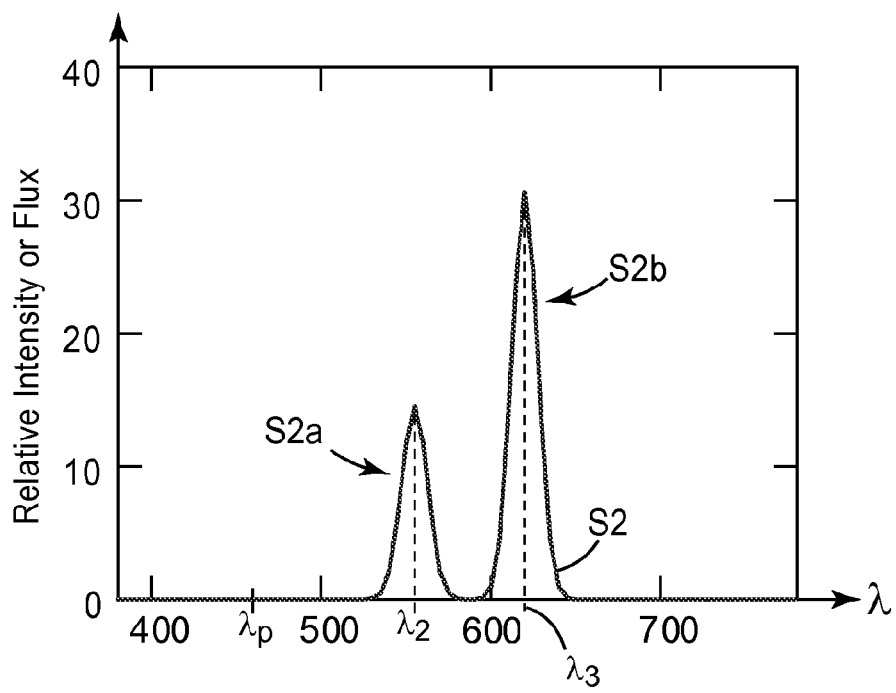

An exemplary semiconductor stack comprising an RSC capable of simultaneously emitting light having a spectrum that includes two peak wavelengths, similar to the spectrum shown in FIG. 3b, is set forth below in Table 2. The stack includes one green-emitting (555 nm) quantum well, producing a green spectral peak, and one red-emitting (620 nm) quantum well, producing a red spectral peak. The relative intensities of the green and red peaks are principally controlled by the thicknesses of the absorber layers associated with the respective quantum wells. By using relatively thin absorber layers adjacent the green-emitting quantum well, more of the pump light will pass through these layers and be absorbed in the absorbing layers adjacent the red-emitting quantum well. This can result in the emission of more red light than green light. The ratio of green light to red light may also be somewhat influenced by the presence of any light-extraction features, e.g., where such features are etched into or attached to the outer surface of the cyan blocker.

TABLE 2

| Layer type | Material | Thickness (nm) | Band gap/ emission energy (eV) | Band gap/ emission wavelength (nm) |
|---|---|---|---|---|
| cyan blocker | Cd0.38Mg0.21Zn0.41Se | 1000 | 2.48 | 500 |
| barrier | Cd0.23Mg0.43Zn0.34Se | 20 | 2.88 | 430 |
| absorber | Cd0.34Mg0.27Zn0.39Se | 150 | 2.58 | 480 |
| quantum well | Cd0.72Zn0.28Se | ~4 | 2.00 | 620 |
| absorber | Cd0.34Mg0.27Zn0.39Se | 150 | 2.58 | 480 |
| barrier | Cd0.23Mg0.43Zn0.34Se | 20 | 2.88 | 430 |
| absorber | Cd0.34Mg0.27Zn0.39Se | 30 | 2.58 | 480 |
| quantum well | Cd0.47Zn0.53Se | ~3 | 2.23 | 555 |
| absorber | Cd0.34Mg0.27Zn0.39Se | 30 | 2.58 | 480 |
| window | Cd0.23Mg0.43Zn0.34Se | 500 | 2.88 | 430 |

The person skilled in the art will understand how to tailor the composition of the CdMgZnSe alloys to achieve the listed band gap energies for the various layers. For example, the band gap energies of the CdMgZnSe alloys are primarily controlled by the Mg content. Emission wavelengths (or energies) of the quantum wells are controlled both by the Cd/Zn ratio, and the precise thickness of the quantum well.

Figure 4:
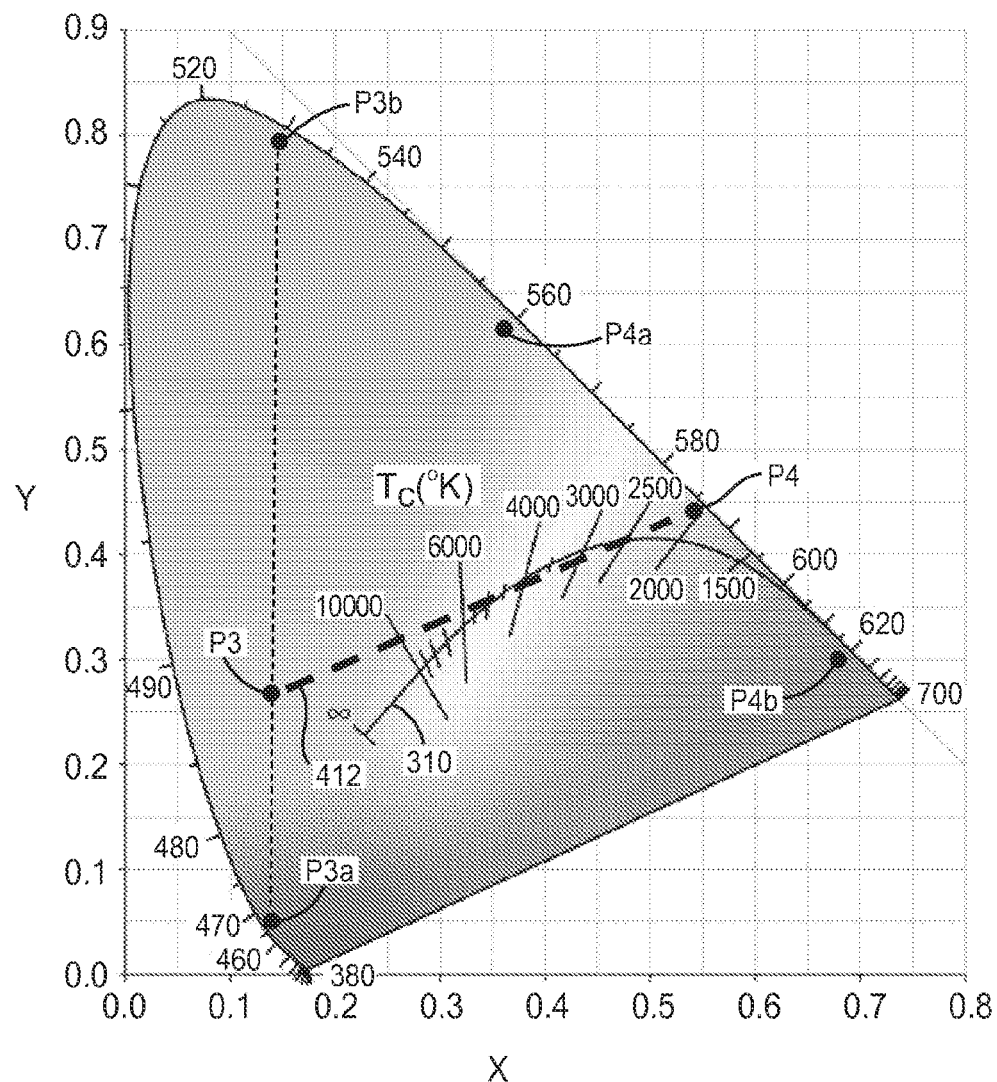
FIG. 4 is a CIE chromaticity diagram on which is plotted a line segment representative of another lighting device.

A chromaticity diagram similar to that of FIG. 3 is shown in FIG. 4. In FIG. 4, curve 310 again represents the Planckian locus as described above. However, FIG. 4 contains other features different from those of FIG. 3, which represent a different particular embodiment or embodiments of a lighting device.

In particular, points P3 and P4 are representative of the colors of the light emitted by a first and second luminescent element, respectively. (Note that one or both of these first and second elements may be different from the first and second luminescent elements described in connection with FIG. 3.) These colors have been specially chosen so that the line segment 412 that connects points P3 and P4 closely approximates the Planckian locus 310 over a substantial portion thereof. In the depicted embodiment, line segment 412 deviates from Planckian locus 310 by no more than a distance of 0.005 on the CIE (x,y) plane over a range of color temperatures (for the Planckian locus) from 3000K to 5000K. Over a wider color temperature range from 2500K to 5000K, the line segment 312 deviates from Planckian locus 310 by no more than a distance of 0.01 on the CIE (x,y) plane. In general, it is desirable for the line segment to deviate from the Planckian locus by a distance of no more than 0.04 or no more than 0.02 on the CIE (x,y) plane, over the stated color temperature ranges.

The line segment 412 represents the set of all possible optical outputs for lighting devices whose outputs are composed of a linear combination of the light emitted by the first luminescent element (represented by P3) and the light emitted by the second luminescent element (represented by P4). Thus, for example, a lighting device whose optical output is composed of equal parts of the light represented by P3 and the light represented by P4 is represented by a point that bisects line segment 412. If the proportion of the light of point P3 is increased, the device output point moves along line segment 412 towards point P3. If instead the proportion of the light of point P4 is increased, the device output point moves along line segment 412 towards point P4. Thus, by adjusting the relative amounts of light emitted by the first and second luminescent elements, the color of the device output can be changed or adjusted.

The colors represented by points P3, P4 may be achieved with many different combinations of electroluminescent sources and light converting elements, since any particular color coordinate on the CIE chromaticity diagram may be associated with numerous optical spectra that may differ substantially from each other. All such combinations are encompassed by the present disclosure. We have found it advantageous, however, to produce one or both of points P3, P4 using a combination of a small number of distinct spectral peaks, e.g., exactly two distinct spectral peaks for one or each point, or exactly three distinct spectral peaks for one or each point, for example.

Figure 4A:
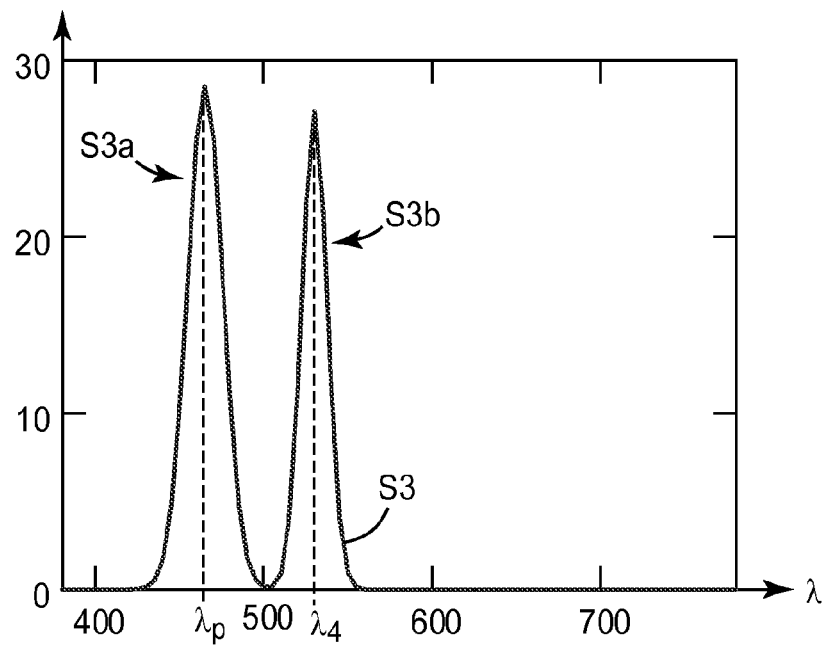
FIGS. 4a and 4b are graphs of the emission spectra of two components of the lighting device of FIG. 4.
Figure 4B:
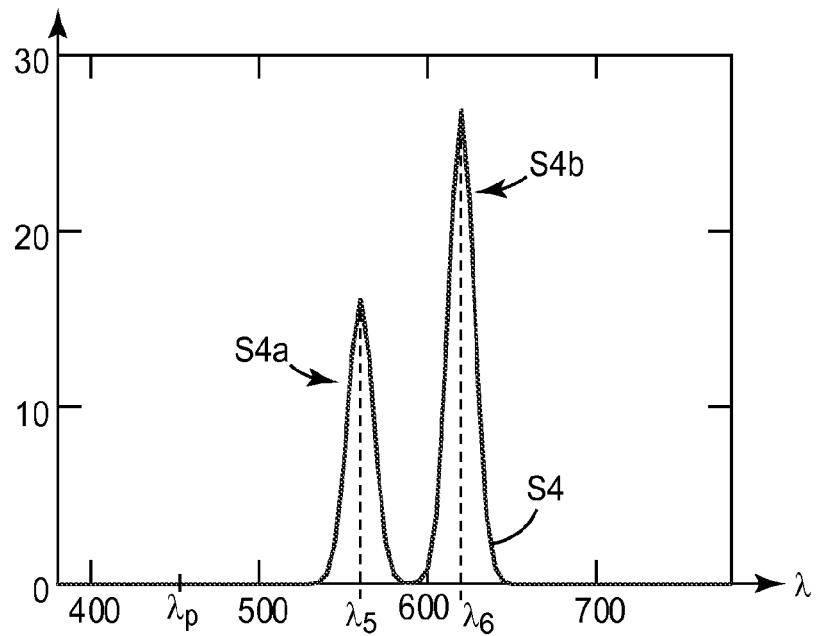

In the embodiment depicted, the light represented by point P3 is a combination of two distinct spectral peaks, one of which is represented by point P3a and the other of which is represented by point P3b. The light represented by point P3a is typical of pump light emitted by a blue LED, having a peak wavelength of about 465 nm and a FWHM spectral width of less than 50 nm, or less than 30 nm, for example 18 nm. The light represented by point P3b is representative of light that is re-emitted from one or more potential wells of an RSC such as is described in connection with FIGS. 1 and 2, when the RSC is excited with blue or other short wavelength pump light. Such potential well(s) in this embodiment are designed to re-emitted light having a peak wavelength of about 530 nm and a FWHM spectral width less than 50 nm, or less than 30 nm, for example 18 nm. FIG. 4a shows a spectrum S3 that is illustrative of points P3, P3a, and P3b. In particular, the spectrum S3 is a mixture or combination of a first spectral peak S3a and a second spectral peak S3b. The first spectral peak S3a has a peak wavelength $\lambda_p$ and a spectral width that is typical of blue pump light emitted by a blue LED, the color of which is represented by point P3a. The second spectral peak S3b has a peak wavelength $\lambda_4$ and a spectral width that is representative of light re-emitted by one or more suitably designed potential wells of an RSC, the color of which is represented by point P3b. The combination of the two spectral peaks S3a, S3b, in suitable relative amounts or proportions, produces the resulting spectrum S3, the color of which is represented by point P3. In the depicted embodiment, the proportion is selected such that the integrated intensity of spectral peak S3a is about 1.5 times the integrated intensity of spectral peak S3b, resulting in a color for point P3 that is substantially cyan. Light having the spectrum S3 can be produced by a first luminescent element that includes a blue light-emitting electroluminescent source over which is applied a suitably designed RSC, where the RSC is designed to transmit the appropriate amount of the blue pump light. Such an RSC would typically not include a cyan blocker layer.

Similarly, in the depicted embodiment, the light represented by point P4 is also a combination of two distinct spectral peaks, one of which is represented by point P4a and the other of which is represented by point P4b. The light represented by point P4a is typical of light re-emitted by one or more potential wells of an RSC when the RSC is excited with blue or other short wavelength pump light. Such potential well(s) in this embodiment are designed to re-emit yellow-green light, having a peak wavelength of about 560 nm and a FWHM spectral width of less than 50 nm, or less than 30 nm, for example 18 nm. The light represented by point P4b is also representative of light that is re-emitted from one or more potential wells of an RSC when illuminated with short wavelength pump light, but the potential well(s) associated with point P4b are different from the potential well(s) associated with point P4a. The potential well(s) associated with point P4b are designed to re-emit red light, having a peak wavelength of about 620 nm and a FWHM spectral width of less than 50 nm, or less than 30 nm, for example 18 nm. The combination of the two spectral peaks S4a, S4b, in suitable relative amounts or proportions, produces the resulting spectrum S4, the color of which is represented by point P4. In the depicted embodiment, the proportion is selected such that the integrated intensity of spectral peak S4b is about 1.7 times the integrated intensity of spectral peak S4a, resulting in a color for point P4 that is substantially amber. Light having the spectrum S4 can be produced by a first luminescent element that includes a blue or other short wavelength pump light-emitting electroluminescent source over which is applied a suitably designed RSC, where the RSC is designed to substantially block the pump light (note the absence of any significant intensity at the pump wavelength $\lambda_p$ in the spectrum S4) and to emit light having the spectral peak S4a and light having the spectral peak S4b in the correct proportion. In order to substantially block the pump light, the RSC may include a light filtering layer such as a cyan blocker as explained above.

To summarize, light source devices have now been described that are capable of providing white light optical outputs, for example by combining a white-light emitting luminescent element with an amber-light emitting luminescent element, or by combining a cyan-light emitting luminescent element with an amber-light emitting luminescent element. Further, the particular color or color temperature of the white light output can be adjusted by adjusting the relative mix of light provided by the different luminescent elements, and the adjusted white light can have a color as represented on the CIE chromaticity diagram that lies on or very close to the Planckian locus over a wide range of color temperatures.

Beyond this, we have also found that embodiments of the type described in connection with FIGS. 3, 3a, 3b and 4, 4a, 4b also advantageously exhibit very good "color rendering" properties. The "color rendering index" (CRI) is a parameter that may be important to a lighting device designer if the designer is concerned not only with the appearance or color of the device optical output as it is perceived by direct observation with the eye, but also with the appearance of objects or articles that are viewed for example in reflected light using the device optical output. Depending on the reflectivity spectrum of the objects or articles, their appearance may be very different when illuminated with a first nominally white light source than when illuminated with a second nominally white light source, even though the first and second white light sources may have identical color coordinates on the CIE chromaticity diagram. This is a consequence of the fact that a particular color coordinate on the CIE chromaticity diagram may be associated with numerous optical spectra that may differ substantially from each other. A common illustration demonstrating the effect of color rendering is the sometimes very different appearance that colored objects have when illuminated with sunlight as compared to illumination with a fluorescent office lights for example, or as compared to illumination with a gas discharge street lamp, even though all of these illumination sources may appear to be nominally white when viewed directly.

The color rendering index of a given source can be measured using the method described in the CIE publication 13.3-1995, "Method of Measuring and Specifying Colour Rendering Properties of Light Sources". The color rendering index in general ranges from a low of 0 to a high of 100, with higher values generally being desirable. Furthermore, numerical techniques and software are available from the CIE, that are capable of calculating the color rendering index of a given spectrum representing a given light source, based on the CIE 13.3-1995 publication.

Figure 5:
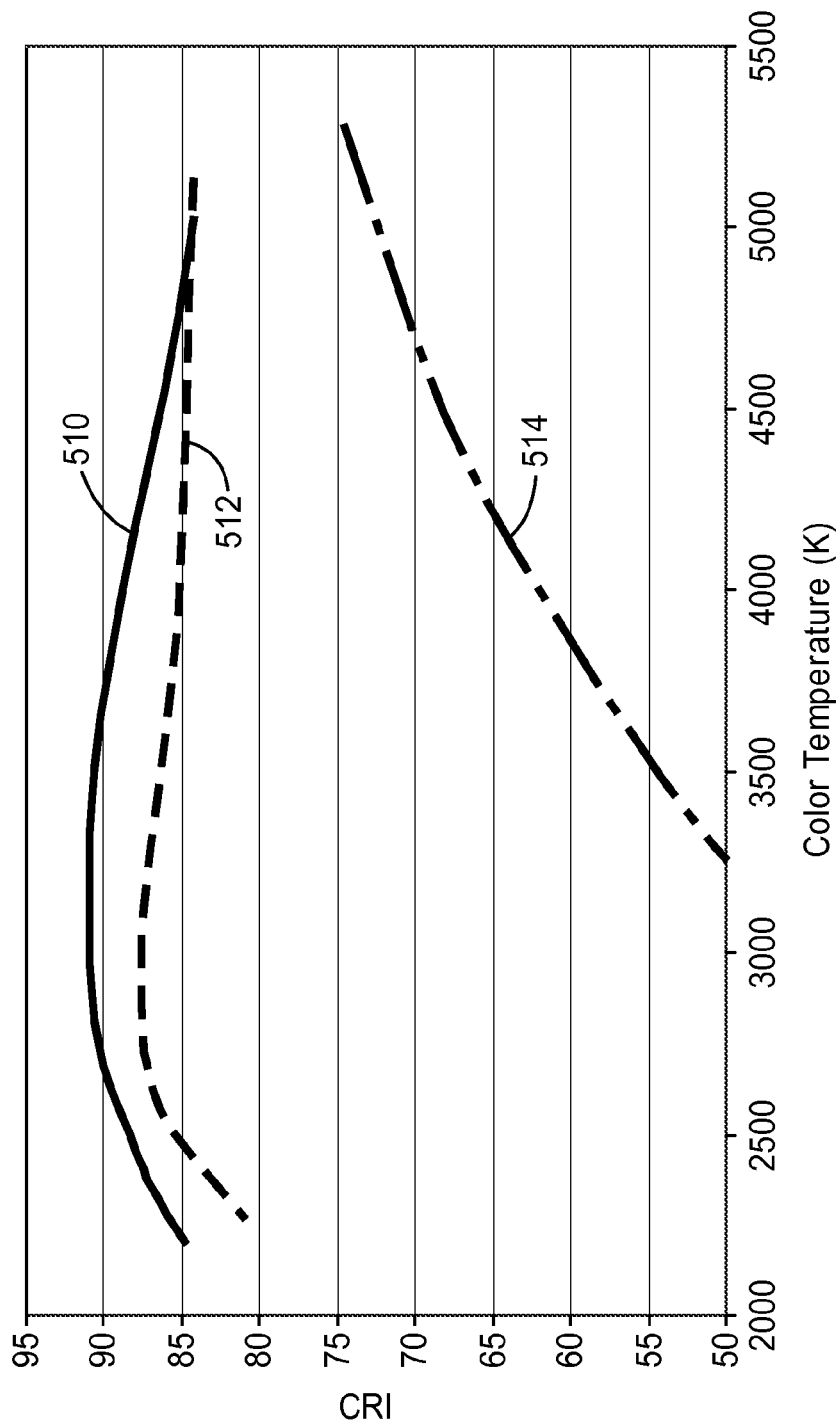
FIG. 5 is a graph of the calculated color rendering index (CRI) as a function of color temperature for the lighting devices of FIGS. 3 and 4.

When such software is used to calculate the color rendering index of device optical outputs composed of a linear combination of the spectra S1 and S2 shown in FIGS. 3a and 3b, the result is a color rendering index of at least 80 over a color temperature range (corresponding to different proportions of the spectra S1 and S2) from 2500K to 5000K. This color rendering index for the FIG. 3a/3b embodiment is shown by curve 510 in FIG. 5, where the calculated color rendering index (CRI) is plotted against the color temperature of the overall device output. Similarly, when the same software is used to calculate the color rendering index of device optical outputs composed of a linear combination of the spectra S3 and S4 shown in FIGS. 4a and 4b, the result is again a color rendering index of at least 80 over a color temperature range (corresponding to different proportions of the spectra S3 and S4) from 2500K to 5000K. This color rendering index for the FIG. 4a/4b embodiment is shown by curve 512 in FIG. 5. An additional curve 514 is provided in FIG. 5. This curve 514 is the calculated CRI for an embodiment similar to that of FIGS. 3/3a/3b, except where the second luminescent element (e.g., a blue-LED-pumped RSC, whose light output is characterized by point P2 in FIG. 3 and by spectrum S2 in FIG. 3b) is replaced by a luminescent element that has an amber-emitting LED but has no RSC or other light-converting element, the amber-emitting LED emitting light in a single spectral peak having a peak wavelength of 592 nm such that its color on the CIE chromaticity diagram substantially corresponds again to the point P2 in FIG. 3. By comparing curve 514 with curve 510, one can see that two devices that have substantially the same color characteristics as plotted on the CIE chromaticity diagram can have very different color rendering characteristics.

In exemplary embodiments, the color rendering index of the disclosed devices is at least 60, or at least 70, or at least 80, over a color temperature range from 2500K to 5000K, or from 3000K to 5000K, for example. In order to achieve high color rendering index values, it is desirable to ensure that each of the constituent spectra (S1, S2) that make up the device optical output is characterized by at least two distinct spectral peaks, e.g. the peaks S1a, S1b of FIG. 3a or the peaks S2a, S2b of FIG. 3b, which peaks may be separated from each other by at least 10 nm, for example. Further, it may be desirable to ensure that each of the constituent spectra that make up the device optical output is characterized by exactly two distinct spectral peaks, or by exactly three distinct spectral peaks, for example.

Having described the desirable color-related properties of exemplary devices, we now turn our attention to some figures that illustrate, in a non-limiting fashion, how the various components of the devices may be physically arranged.

Figure 6:
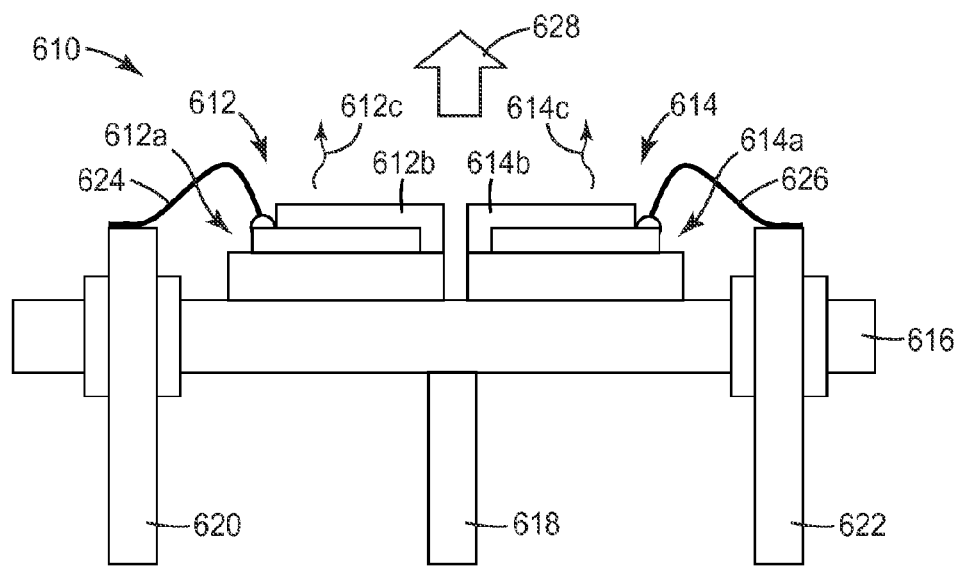
FIGS. 6 and 7 are schematic sectional views of further lighting devices.

FIG. 6 is a schematic sectional view of an exemplary lighting device 610. The device includes a first luminescent element 612 and a second luminescent element 614, both mounted on a metal header 616. The header 616 has a first conductive post 618 integral with the header, and second and third conductive posts 620, 622 that are electrically insulated from each other and from the main disk-shaped portion of the header on which the elements 612, 614 are mounted. Post 620 electrically couples to a first electrical contact of the first luminescent element 612 via a wire 624 and wire bond, and similarly post 622 electrically couples to a first electrical contact of the second luminescent element 614 via a wire 626 and wire bond. The first and second luminescent elements also each have second electrical contacts, which are both in ohmic contact with the main disk-shaped portion of the header 616 and thus also with the post 618.

The first luminescent element 612 includes a first electroluminescent source 612a that emits a first pump light, and a first light converting element 612b that converts at least some of the first pump light to a first re-emitted light component. The source 612a may be or comprise an LED, laser diode, or similar solid-state electroluminescent source that is adapted to emit pump light of a suitable intensity and spectrum. The first and second electrical contacts of the first luminescent element 612 discussed above are provided on the source 612a so that it can emit pump light in response to a first electrical signal applied across posts 618, 620. The light converting element 612b may be or comprise one or more RSCs, and/or one or more phosphors, for example. The source 612a and element 612b work together so that the element 612 emits light 612c having a first spectral distribution. The light 612c typically includes at least the first re-emitted light component from the element 612b, and may also include some of the first pump light emitted by the source 612a, depending on the desired spectral properties of the light 612c as described in detail above.

The second luminescent element 614 includes a second electroluminescent source 614a that emits a second pump light, and a second light converting element 614b that converts at least some of the second pump light to a second re-emitted light component. The source 614a may be or comprise an LED, laser diode, or similar solid-state electroluminescent source that is adapted to emit pump light of a suitable intensity and spectrum. The first and second electrical contacts of the second luminescent element 614 discussed above are provided on the source 614a so that it can emit pump light in response to a second electrical signal applied across posts 618, 622. The light converting element 614b may be or comprise one or more RSCs, and/or one or more phosphors, for example. Preferably, at least one of light converting element 612b and light converting element 614b includes at least one potential well. The source 614a and element 614b work together so that the element 614 emits light 614c having a second spectral distribution. The light 614c typically includes at least the second re-emitted light component from the element 614b, and may also include some of the pump light emitted by the source 614a, depending on the desired spectral properties of the light 614c as described in detail above.

The light 612c and the light 614c combine, whether by free space propagation or via mechanisms such as optical diffusers, lenses, mirrors, or the like, and optionally with other light components, to produce a device optical output of the device 610 represented schematically by arrow 628. The device optical output 628 thus includes some amount of light 612c and some amount of light 614c. The relative amounts of lights 612c, 614c that are present in the output 628 control the perceived color, e.g. the color temperature, of the device output 628. These relative amounts, and hence the device output color, can be controlled by independent or separate electrical control of the different luminescent elements 612, 614. Thus, the first luminescent element 612 can be energized by applying a first electrical signal, e.g., an electric current of a given magnitude, across posts 618, 620. The second luminescent element 614 can be energized by applying a second electrical signal that is independent and/or distinct from the first electrical signal, across posts 618, 622. The magnitudes of the first and second electrical signals are used to control the amount of light emitted by the first and second luminescent elements 612, 614, and the color temperature of the output 628.

Figure 7:
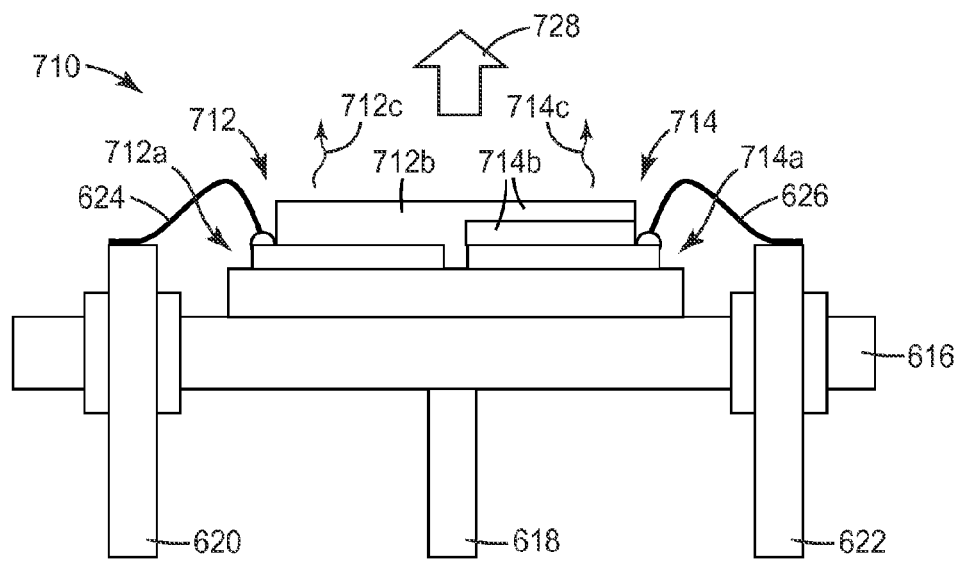

FIG. 7 is a schematic sectional view of an exemplary lighting device 710 similar to device 610. Like reference numerals designate like elements, with no further discussion thereof being necessary. Device 710 includes a first luminescent element 712 and a second luminescent element 714, both mounted on the metal header 616. Post 620 electrically couples to a first electrical contact of the first luminescent element 712, and post 622 electrically couples to a first electrical contact of the second luminescent element 714. The first and second luminescent elements also each have second electrical contacts, which are both in ohmic contact with the main disk-shaped portion of the header 616 and thus also with the post 618.

The first and second luminescent elements 712, 714 are similar to elements 612, 614 described above, with first element 712 including a first electroluminescent source 712a that emits a first pump light, and a first light converting element 712b that converts at least some of the first pump light to a first re-emitted light component, and with second element 714 including a second electroluminescent source 714a that emits a second pump light, and a second light converting element 714b that converts at least some of the second pump light to a second re-emitted light component. The electroluminescent sources 712a, 714a differ from sources 612a, 614a insofar as sources 612a, 614a are provided by separate semiconductor (e.g., LED) chips, whereas sources 712a, 714a are provided by separate pn junctions on the same semiconductor (e.g., LED) chip. In both cases, however, the first and second electroluminescent sources (whether 612a and 614a, or 712a and 714a) are independently and/or distinctly controllable by separate electrical signals. Also, in both cases the first and second electroluminescent sources may emit pump light having the same spectrum, or may emit pump light of different spectra.

The first and second electrical contacts of the first luminescent element 712 discussed above are provided on the source 712a so that it can emit the first pump light in response to a first electrical signal applied across posts 618, 620. The light converting element 712b may be or comprise one or more RSCs, and/or one or more phosphors, for example. The source 712a and element 712b work together so that the element 712 emits light 712c having a first spectral distribution. The first and second electrical contacts of the second luminescent element 714 are provided on the source 714a so that it can emit the second pump light in response to a second electrical signal applied across posts 618, 622. The light converting element 714b may be or comprise one or more RSCs, and/or one or more phosphors, for example, but preferably at least one of light converting element 712b and light converting element 714b includes at least one potential well.

The source 714a and element 714b work together so that the element 714 emits light 714c having a second spectral distribution. The light 714c typically includes at least the second re-emitted light component from the element 714b, and may also include some of the pump light emitted by the source 714a, depending on the desired spectral properties of the light 714c as described in detail above.

Note that unlike the device of FIG. 6, in FIG. 7 a unitary light converting layer is provided that covers both electroluminescent source 712a and electroluminescent source 714a, with a portion of such unitary light converting layer forming the first light converting element 712b, and another portion of such unitary light converting layer forming a portion of the second light converting element 714b. As seen in FIG. 7, the second light converting element 714b additionally includes another light converting element that is not present in the first light converting element 712b.

The light 712c and the light 714c combine, whether by free space propagation or via mechanisms such as optical diffusers, lenses, mirrors, or the like, and optionally with other light components, to produce a device optical output of the device 710 represented schematically by arrow 728. The relative amounts of lights 712c, 714c that are present in the output 728 control the color temperature or other perceived color of the device output 728. These relative amounts, and hence the device output color, can be controlled by independent or separate electrical control of the different luminescent elements 712, 714. Thus, the first luminescent element 712 can be energized by applying a first electrical signal across posts 618, 620, and the second luminescent element 714 can be energized by applying a second electrical signal that is independent and/or distinct from the first electrical signal, across posts 618, 622. The magnitudes of the first and second electrical signals are used to control the amount of light emitted by the first and second luminescent elements 712, 714, and the color temperature of the output 728.

Figure 8:
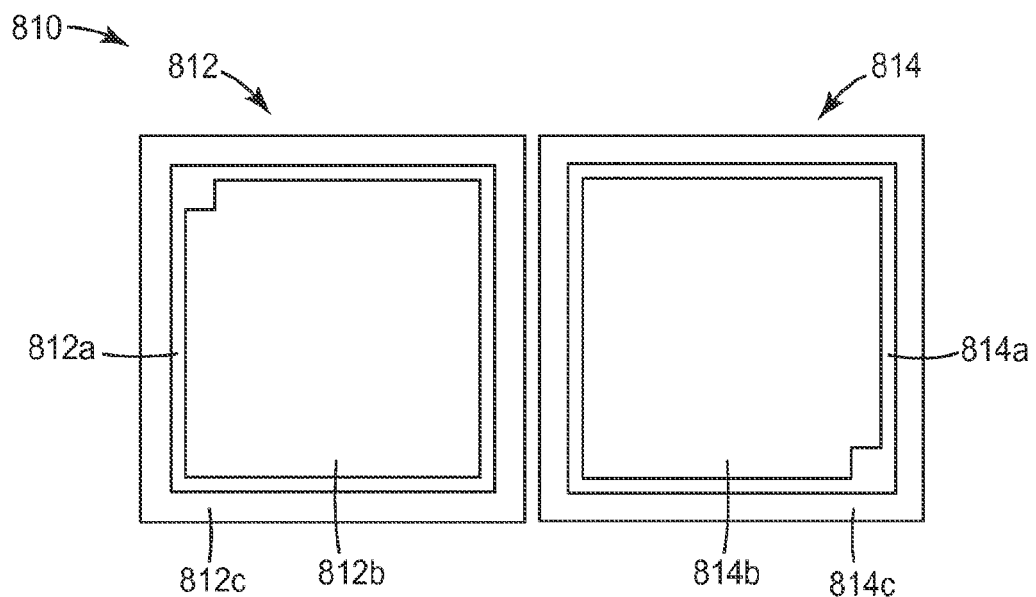
FIGS. 8 and 9 are schematic top views of further lighting devices.

FIG. 8 is a schematic top view of another lighting device 810, the design of which may be substantially applied to either of devices 610 (FIG. 6) or 710 (FIG. 7). The device 810 includes a first luminescent element 812 and a second luminescent element 814. A generally square-shaped electrical contact 812a having a narrow line width is provided on a first electroluminescent source of the first element 812. The element 812 also includes a first light converting element 812b disposed at least on a central region of the element 812 bounded by the square-shaped contact 812a. A peripheral region 812c of the element 812 may also be covered with the first light converting element 812b, or it may comprise no light converting element, but rather simply be an exposed portion of the first electroluminescent source.

Another generally square-shaped electrical contact 814a having a narrow line width is also provided on a second electroluminescent source of the second element 814. The element 814 also includes a second light converting element 814b disposed at least on a central region of the element 814 bounded by the square-shaped contact 814a. A peripheral region 814c of the element 812 may also be covered with the second light converting element 812b, or it may comprise no light converting element, but rather simply be an exposed portion of the second electroluminescent source.

Figure 9:
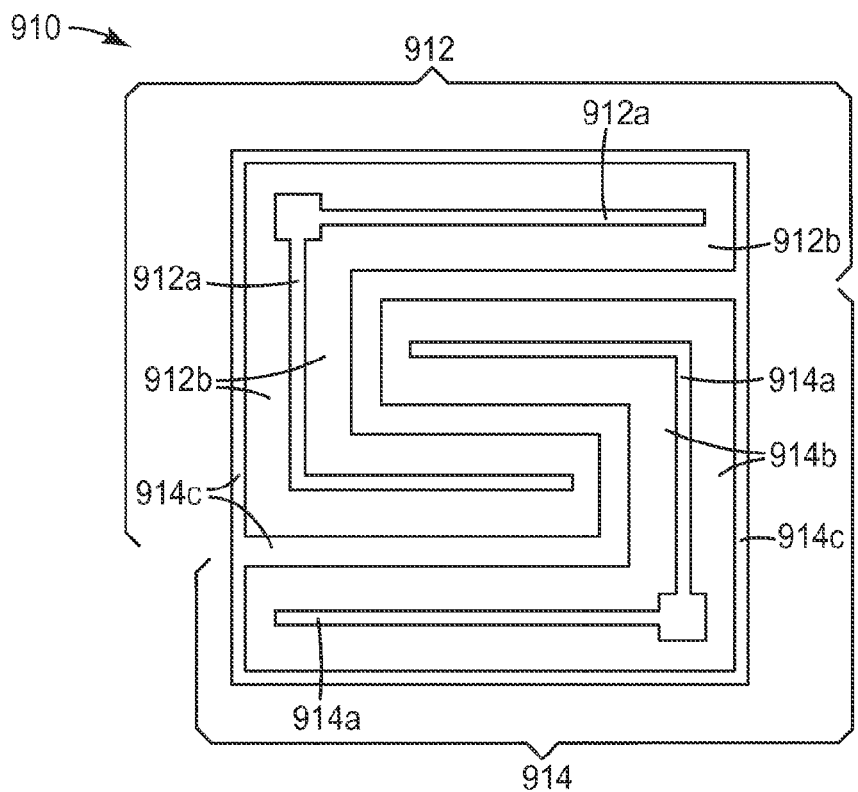

FIG. 9 is a schematic top view of another lighting device 910, the design of which may be substantially applied to device 710 (FIG. 7), for example. The device 910 includes a first generally U-shaped luminescent element 912 and a second generally U-shaped luminescent element 914, the two elements forming an interlocking pattern to provide a generally square overall outline or border. A generally U-shaped electrical contact 912a having a narrow line width is provided on a first electroluminescent source of the first element 912. The element 912 also includes a first light converting element 912b disposed on the first electroluminescent source in regions close to the contact 912a.

Another generally U-shaped electrical contact 914a having a narrow line width is also provided on a second electroluminescent source of the second element 914. The element 914 also includes a second light converting element 914b disposed on the second electroluminescent source in regions close to the contact 914a.

Remaining regions 914c of the device 910 may be covered with the first light converting element 912b and/or with the second light converting element 914b, or they may comprise no light converting element, but rather simply be an exposed portion of the first and/or second electroluminescent sources. The interdigited design of device 910 may facilitate mixing the light from the electroluminescent elements 912 and 914.

The embodiments of FIGS. 6 and 7 demonstrate how the two luminescent elements of the lighting device can be independently controlled using three electrical terminals or contacts, where one terminal (post 618) is common to both elements, and each of the other terminals (posts 620, 622) is dedicated to only one of the elements. Independent control can be achieved by applying a first electrical signal across one pair of terminals (posts 618, 620), and a second electrical signal (independent of the first electrical signal) across another pair of terminals (posts 618, 622). Of course, four-terminal devices are also contemplated, wherein no terminal is common to both elements, and a given pair of terminals is dedicated to a given one of the luminescent elements.

Figure 10:
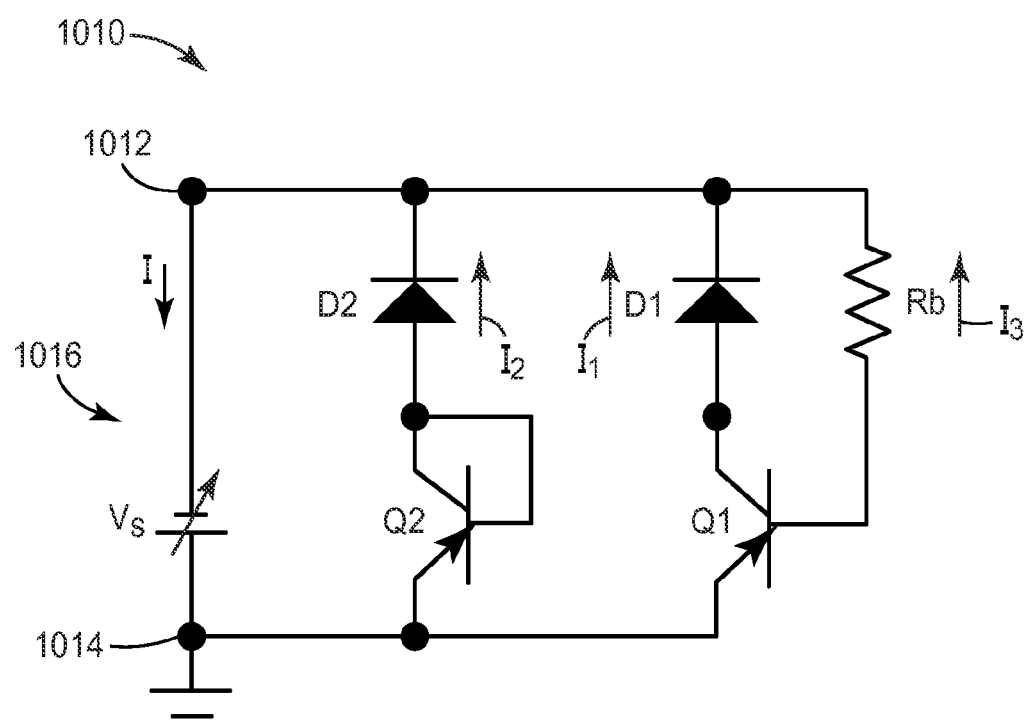
FIG. 10 is a diagram of a circuit that can be used to automatically adjust the proportion of light emitted by first and second luminescent elements of a lighting device.

In FIG. 10, we disclose a circuit 1010 that has only two input terminals and that can be used to drive the two luminescent elements of the disclosed lighting devices by different amounts so as to achieve color control or adjustment as a function of the magnitude of the electrical input provided at the two input terminals. In the circuit, terminals 1012 and 1014 are the input terminals. An external variable or adjustable source 1016 is coupled across the input terminals as shown. The source 1016, which may be a voltage source or a current source, provides a variable voltage $V_s$ and variable current I to the lighting device. The lighting device includes a first luminescent element that has a first electroluminescent source and a first light converting element that converts at least some pump light provided by the first electroluminescent source to a first re-emitted light component. The lighting device also includes a second luminescent element that has a second electroluminescent source and a second light converting element that converts at least some pump light provided by the second electroluminescent source to a second re-emitted light component.

In the circuit 1010, the first electroluminescent source, which may for example be or comprise an LED, is represented as a diode D1, and the second electroluminescent source, which may be or comprise a different LED, is represented as a diode D2. The diodes connect to the other circuit elements as shown, namely, transistors Q1 and Q2, and base resistor Rb, to complete the circuit 1010. The electrical current that flows through the diode D1, the diode D2, and the base resistor Rb are labeled $I_1$, $I_2$, and $I_3$, respectively. These currents add up to the source current I, i.e., $I_1+I_2+I_3=I$. The reader will note that the transistor Q1 and base resistor Rb, as connected, cause the current $I_1$ flowing through the diode D1 to be substantially limited to a value determined mainly by Rb and the current gain of transistor Q1. On the other hand, the transistor Q2, which is wired to function as a diode, causes the diode D2 to not turn on significantly until after the branch of the circuit containing diode D1 has saturated.

These differences in response to an electrical signal applied across the input terminals 1012, 1014 cause different relative amounts of light to be emitted by diodes D1 and D2, and thus different relative amounts of light to be emitted by the first and second luminescent elements of the lighting device, and thus different colors or color temperatures to be provided by the lighting device optical output, as a function of the magnitude of the applied electrical signal. For example, if the first luminescent element (of which diode D1 is a part) emits warm white light, and the second luminescent element (of which diode D2 is a part) emits cool white light, then the effect of the circuit 1010 is to provide a combined output (i.e., a lighting device optical output) of substantially warm white light at low applied currents, but which output shifts to progressively cooler and brighter white as the applied current is increased. Such performance may be desirable because it approximates the familiar dimming behavior of an incandescent light source. The circuit 1010 can thus operate as a color-changing dimming circuit.

Figure 11A:
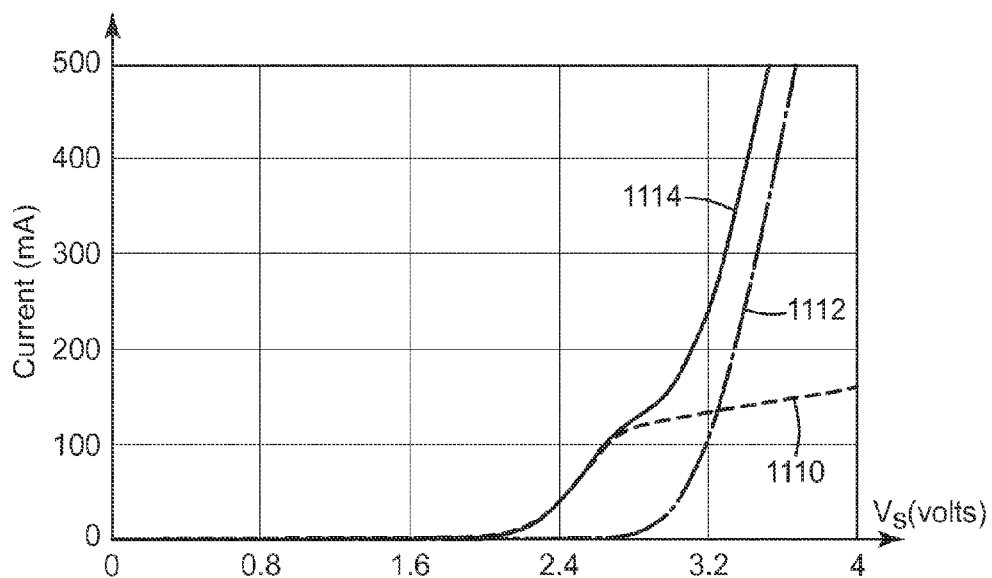
FIG. 11a is a graph of electrical current flowing through the respective diodes in the circuit of FIG. 10, representative of the amount of light emitted by the respective diodes, as a function of the electric potential or voltage of the applied signal.
Figure 11B:
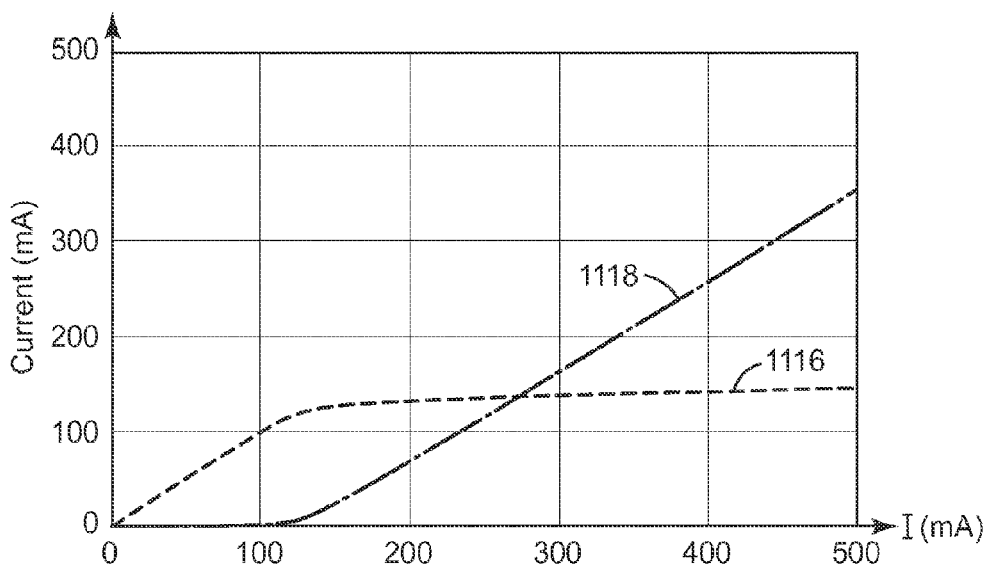
FIG. 11b is a graph similar to that of FIG. 11a but where the responses are graphed as a function of the total diode current.

For completeness, FIGS. 11*a* and 11*b* illustrate the modeled behavior of the circuit 1010, where the value of Rb was assumed to be 500 ohms. In both figures, the y-axis represents the electrical current in milliamperes flowing through a given circuit element or elements. In FIG. 11*a*, the x-axis represents the voltage $V_s$ provided by the external power source. Curve 1110 represents the current $I_1$ flowing through diode D1, curve 1112 represents the current $I_2$ flowing through the diode D2, and curve 1114 represents the sum of these currents, $I_1+I_2$. In FIG. 11*b*, the x-axis represents the total current flowing through both diodes, i.e., $I_1+I_2$. Curve 1116 represents the current $I_1$ flowing through diode D1, and curve 1118 represents the current $I_2$ flowing through the diode D2.

One or more components of the circuit 1010, such as the transistors and/or the base resistor, may be fabricated in a silicon substrate or other semiconductor substrate used for "metal bonded" GaN LEDs. Alternatively, such circuit components may be fabricated to be physically separated and remote from the semiconductor devices responsible for light emission.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. A solid state lighting device, comprising:
   a first luminescent element configured to emit light having a first spectral distribution, the first luminescent element comprising:
   a first electroluminescent source emitting a first pump light, and
   a first light converting element that converts at least some of the first pump light to a first re-emitted light component; and
   a second luminescent element configured to emit light having a second spectral distribution, the second luminescent element comprising:
   a second electroluminescent source emitting a second pump light, and
   a second light converting element that converts at least some of the second pump light to a second re-emitted light component;
   wherein at least one of the first and second light converting elements comprises a first semiconductor stack including a first potential well;
   wherein the first and second luminescent elements are disposed so that the light emitted by the first and second luminescent elements combine to provide a device output; and
   wherein the first and second spectral distributions can be represented by first and second endpoints, respectively, on a line segment on a standard CIE (x,y) color coordinate diagram, the line segment representing a range of possible device outputs for different relative amounts of the light emitted by the first luminescent element and the light emitted by the second luminescent element, at least a portion of the line segment also approximating a Planckian locus at least over a range of color temperatures from 3000K to 5000K.

2. The device of claim 1, wherein the line segment deviates from the Planckian locus by a distance of less than 0.04 on the CIE (x,y) plane over the color temperature range from 3000K to 5000K.

3. The device of claim 1, wherein the possible device outputs represented by the line segment maintain a color rendering index of at least 60 over the color temperature range from 3000K to 5000K.

4. The device of claim 3, wherein the possible device outputs represented by the line segment maintain a color rendering index of at least 80 over the color temperature range from 3000K to 5000K.

5. The device of claim 1, wherein the first pump light has a first peak wavelength $\lambda_{1p}$ and the second pump light has a second peak wavelength $\lambda_{2p}$, and where $\lambda_{1p}$ is substantially the same as $\lambda_{2p}$.

6. The device of claim 1, wherein the first and second pump lights each exhibit a peak wavelength in a range from 350 to 500 nm.

7. The device of claim 1, wherein the first and second electroluminescent sources comprise different portions of a unitary semiconductor element.

8. The device of claim 1, wherein the first and second electroluminescent sources comprise distinct semiconductor elements.

9. The device of claim 1, wherein the first light converting element comprises a phosphor, and wherein the second light converting element comprises the first semiconductor stack including the first potential well.

10. The device of claim 9, wherein the phosphor emits yellow light, and the first semiconductor stack emits amber light.

11. The device of claim 10, wherein the second spectral distribution consists essentially of a first emission band having a peak emission between 500 and 600 nm, and a second emission band having a peak emission between 600 and 700 nm.

12. The device of claim 11, wherein the first emission band has a FWHM width of no more than 50 nm, and the second emission band has a FWHM spectral width of no more than 50 nm.

13. The device of claim 12, wherein the possible device outputs represented by the line segment maintain a color rendering index of at least 60 over the color temperature range from 3000K to 5000K.

14. The device of claim 1, wherein the first light converting element comprises the first semiconductor stack, and the second light converting element comprises a second semiconductor stack that includes a second potential well.

15. The device of claim 14, wherein first semiconductor stack includes a third potential well and the second semiconductor stack includes a fourth potential well, and wherein the first, second, third, and fourth potential wells are capable of generating re-emitted light whose peak wavelengths differ from each other by at least 10 nm.

16. The device of claim 15, wherein the first spectral distribution is characterized by a cyan color, and the second spectral distribution is characterized by an amber color.

17. The device of claim 15, wherein the first spectral distribution comprises a first emission band having a peak emission between 400 nm and 500 nm, and a second emission band having a peak emission between 500 nm and 600 nm.

18. The device of claim 17, wherein the second spectral distribution comprises a third emission band having a peak emission between 500 nm and 600 nm, and a fourth emission band having a peak emission between 600 nm and 700 nm.

19. The device of claim 18, wherein the first, second, third, and fourth emission bands each have a FWHM spectral width of no more than 50 nm, and wherein the possible device outputs represented by the line segment maintain a color rendering index of at least 60 over the color temperature range from 3000K to 5000K.

20. The device of claim 19, wherein the possible device outputs represented by the line segment maintain a color rendering index of at least 80 over the color temperature range from 3000K to 5000K.

* * * * *